US008415957B2

(12) United States Patent
Huang et al.

(10) Patent No.: US 8,415,957 B2
(45) Date of Patent: Apr. 9, 2013

(54) CAPACITANCE MEASUREMENT CIRCUIT AND METHOD

(75) Inventors: He-Wei Huang, Hsinchu (TW); Chih-Yuan Chang, Changhua County (TW); Hui-Hung Chang, Keelung (TW)

(73) Assignee: Novatek Microelectronics Corp., Hsinchu (TW)

( * ) Notice: Subject to any disclaimer, the term of this patent is extended or adjusted under 35 U.S.C. 154(b) by 659 days.

(21) Appl. No.: 12/639,484

(22) Filed: Dec. 16, 2009

(65) Prior Publication Data

US 2011/0001491 A1 Jan. 6, 2011

(30) Foreign Application Priority Data

Jul. 2, 2009 (TW) .............................. 98122437 A

(51) Int. Cl.
*G01R 27/26* (2006.01)

(52) U.S. Cl.
USPC ........... 324/658; 324/548; 324/676; 324/677; 324/678; 324/661; 324/662; 345/173; 345/174; 178/18.06; 178/19.03

(58) Field of Classification Search ................... 324/658, 324/548, 676–678, 661, 662; 345/173, 174; 178/18.06, 19.03
See application file for complete search history.

(56) References Cited

U.S. PATENT DOCUMENTS

| | | | | |
|---|---|---|---|---|
| 2,953,752 A | * | 9/1960 | Porter | 330/9 |
| 3,091,762 A | * | 5/1963 | Schwertz | 342/136 |
| 3,559,077 A | * | 1/1971 | Porter | 377/97 |
| 4,058,757 A | * | 11/1977 | Welton et al. | 318/474 |
| 6,191,723 B1 | * | 2/2001 | Lewis | 341/166 |
| 6,212,082 B1 | * | 4/2001 | Bailly | 363/89 |
| 6,864,691 B2 | * | 3/2005 | Palata et al. | 324/658 |
| 6,989,826 B2 | * | 1/2006 | Kasai | 345/204 |
| 7,589,538 B2 | * | 9/2009 | Novikov et al. | 324/676 |
| 7,880,650 B2 | * | 2/2011 | Feddeler et al. | 341/120 |
| 8,115,747 B2 | * | 2/2012 | Chang et al. | 345/173 |
| 2001/0022510 A1 | * | 9/2001 | Okamura et al. | 320/166 |
| 2002/0067632 A1 | * | 6/2002 | Batson et al. | 365/49 |
| 2003/0142568 A1 | * | 7/2003 | Giove et al. | 365/207 |
| 2008/0068029 A1 | * | 3/2008 | Tanida et al. | 324/658 |
| 2008/0169826 A1 | * | 7/2008 | Bartling | 324/658 |
| 2008/0297175 A1 | | 12/2008 | Wu | |
| 2009/0278590 A1 | * | 11/2009 | Chang | 327/434 |

(Continued)

FOREIGN PATENT DOCUMENTS

CN 101063697 10/2007
WO WO-2009/007500 A1 1/2009

OTHER PUBLICATIONS

Kiyotake et al., "Single-phase voltage-doubler rectifier using a capacitive energy storage/transfer mechanism", IEE Proceedings Electric Power Applications, Jan. 2003, pp. 81-87.*

(Continued)

*Primary Examiner* — Jermele M Hollington
*Assistant Examiner* — Lamarr Brown
(74) *Attorney, Agent, or Firm* — Rabin & Berdo, P.C.

(57) ABSTRACT

A capacitance measurement circuit and method are provided. A storage capacitor is pre-charged. Charge transfer is performed between an under-test capacitor and the storage capacitor. The storage capacitor is discharged and charged according to a relationship between a voltage of the storage capacitor and a reference voltage. The capacitance of the under-test capacitor is measured according to the voltage on the storage capacitor.

22 Claims, 8 Drawing Sheets

U.S. PATENT DOCUMENTS

| | | | | |
|---|---|---|---|---|
| 2009/0289908 A1* | 11/2009 | Chen et al. | | 345/173 |
| 2010/0026233 A1* | 2/2010 | Lee et al. | | 320/101 |
| 2010/0141275 A1* | 6/2010 | Matsushima | | 324/678 |
| 2010/0185884 A1* | 7/2010 | Chen et al. | | 713/321 |
| 2010/0207905 A1* | 8/2010 | Chang et al. | | 345/174 |
| 2010/0214255 A1* | 8/2010 | Chang et al. | | 345/174 |
| 2010/0253639 A1* | 10/2010 | Huang et al. | | 345/173 |
| 2010/0321328 A1* | 12/2010 | Chang et al. | | 345/174 |
| 2011/0050255 A1* | 3/2011 | Iriarte et al. | | 324/679 |
| 2011/0057899 A1* | 3/2011 | Sleeman et al. | | 345/174 |
| 2011/0310025 A1* | 12/2011 | Simmons | | 345/173 |
| 2012/0105372 A1* | 5/2012 | Chang et al. | | 345/174 |
| 2012/0268420 A1* | 10/2012 | Marhefka et al. | | 345/174 |
| 2012/0268423 A1* | 10/2012 | Hotelling et al. | | 345/174 |
| 2012/0268670 A1* | 10/2012 | Yamazaki | | 349/12 |
| 2012/0274583 A1* | 11/2012 | Haggerty | | 345/173 |
| 2012/0274594 A1* | 11/2012 | Prest et al. | | 345/173 |
| 2012/0274595 A1* | 11/2012 | Lee et al. | | 345/173 |
| 2012/0274597 A1* | 11/2012 | Forstall et al. | | 345/173 |
| 2012/0274605 A1* | 11/2012 | Anno | | 345/174 |
| 2012/0280928 A1* | 11/2012 | Ludwig | | 345/173 |

OTHER PUBLICATIONS

Ennis et al., "Recent Advances in High Voltage, High Energy Capacitor Technology", 16th IEEE International Pulsed Power Conference 2007, pp. 282-285.*

MacDougall et al., "Fast Discharge, High Energy Density Capacitor Performance", Power Modulator Symposium 2006, p. 196.*

Shkuratov et al., "Single-Shot, Repetitive, and Lifetime High-Voltage Testing of Capacitors", IEEE Transactions on Plasma Science, vol. 30, No. 5, Oct. 2002, pp. 1943-1949.*

Heljestrand et al., "Overstressing of High-Voltage Capacitors", IEEE Transactions on Plasma Science, vol. 32, No. 3, Jun. 2004, pp. 1337-1343.*

* cited by examiner

CAPACITANCE MEASUREMENT CIRCUIT AND METHOD

This application claims the benefit of Taiwan application Serial No. 98122437, filed Jul. 2, 2009, the subject matter of which is incorporated herein by reference.

BACKGROUND

1. Field

The invention relates in general to a capacitance measurement circuit and method for measuring a capacitance of an under-test capacitor.

2. Description of the Related Art

Currently, user control interface is implemented by touch control switch such as capacitive switch. When touched by the user, the touch control switch will respond to the user's control command to execute corresponding operations such as the ON/OFF operations.

To further improve the convenience in use, touch panel or display touch panel (having both display and touch control functions) is already provided. The touch panel or the display touch panel responses to the user's input and clicking etc. The touch panel or the display touch panel is used in various electronic devices such as mobile phones for example. The user can operate the electronic device by clicking on the touch panel or the display touch panel and such operation mode is indeed much more user friendly.

When the user operates a capacitive touch panel, a capacitive display touch panel, or a capacitive switch, the capacitance of the under-test (unknown) capacitor therein will change accordingly. Thus, the user's operation (for example, whether the user presses the switch) or the user's touch position on the touch panel or the display touch panel can be detected. However, how to design a capacitance measurement circuit capable of detecting the under-test capacitor so as to improve the performance of the electronic device is a focus of development in the semiconductor industry.

In measurement of the capacitance of the under-test capacitor, the voltage on a storage capacitor is measured, wherein the capacitance of the storage capacitor is already known. FIG. 1A and FIG. 1B show voltage curves of a storage capacitor. Different under-test capacitors correspond to different voltage curves.

As indicated in FIG. 1A, the voltages (Vdet1, Vdet2, Vdet3) of the storage capacitors corresponding to different under-test capacitors (Cx1, Cx2, Cx3) are measured at time t. Relative capacitance of the under-test capacitor can be estimated according to these voltage values. Based on the relative capacitance, the absolute capacitance of the under-test capacitor can be obtained accordingly.

As indicated in FIG. 1B, the time periods t1, t2, t3 during which the voltages Vdet of the storage capacitors boosts to a predetermined voltage Vref are measured. Likewise, relative capacitance of the under-test capacitor can be estimated according to these time periods.

When the under-test capacitor has resistor effect (which can be regarded as the under-test capacitor is serially connected to a resistor), the abovementioned voltage curves will change. FIG. 1C and FIG. 1D show voltage of storage capacitors when the under-test capacitor has resistor effect. When the under-test capacitor has resistor effect, it takes a longer period to measure a satisfactory voltage of the storage capacitor. Or, it takes a longer period for the voltage of the storage capacitor to achieve the predetermined voltage Vref. Thus, the speed of capacitance measurement is slowed down.

Therefore, examples of the invention provide a capacitance measurement circuit and a method thereof, capable of shortening the measurement time despite the under-test capacitor has resistor effect.

SUMMARY OF THE INVENTION

Examples of the invention are directed to a capacitance measurement circuit and a method therefore, capable of shortening the measurement time.

According to a first example of the present invention, a capacitance measuring method for measuring a capacitance of an under-test capacitor is provided. A storage capacitor is pre-charged. Charge transfer is performed between the under-test capacitor and the storage capacitor. Then, the storage capacitor is discharged and charged according to a relationship between a voltage of the storage capacitor and a reference voltage. The capacitance of the under-test capacitor is measured according to the voltage of the storage capacitor.

According to a second example of the present invention, a capacitance measurement circuit for measuring a capacitance of an under-test capacitor is provided. The capacitance measurement circuit includes a storage capacitor, a switch circuit, a voltage detector, a switch controller, and a programmable current source. The switch circuit is coupled to the storage capacitor, a reference voltage and a voltage source. The voltage detector is coupled to the storage capacitor for detecting a voltage of the storage capacitor. The switch controller is coupled to the voltage detector and the switch circuit for controlling the switch circuit. The programmable current source is coupled to the switch circuit. Under control of the switch controller, the reference voltage is coupled to the storage capacitor through the switch circuit to pre-charge the storage capacitor. The under-test capacitor is coupled to the storage capacitor and voltage source for performing charge transfer between the under-test capacitor and the storage capacitor. The programmable current source discharges the storage capacitor according to the relationship between the voltage of the storage capacitor and a reference voltage. The under-test capacitor charges the storage capacitor by charge transfer according to a relationship between the voltage of the storage capacitor and the reference voltage.

It is to be understood that both the foregoing general description and the following detailed description are exemplary and explanatory only and are not restrictive of the disclosed embodiments, as claimed.

DETAILED DESCRIPTION OF EXEMPLARY EMBODIMENT OF THE INVENTION

First Embodiment

Figure 1A:
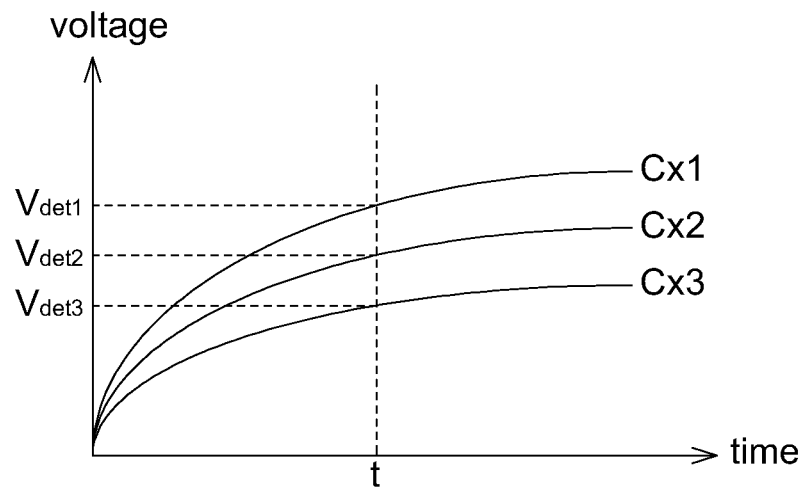
FIG. 1A and FIG. 1B show voltage curves of a storage capacitor.
Figure 1B:
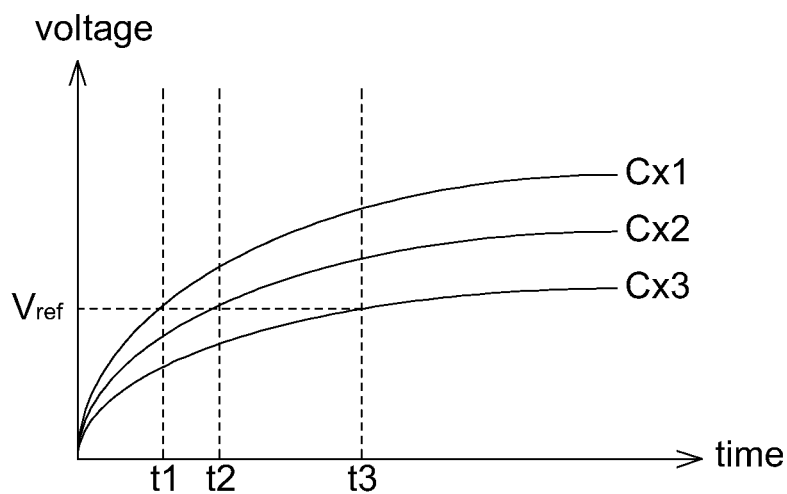
Figure 1C:
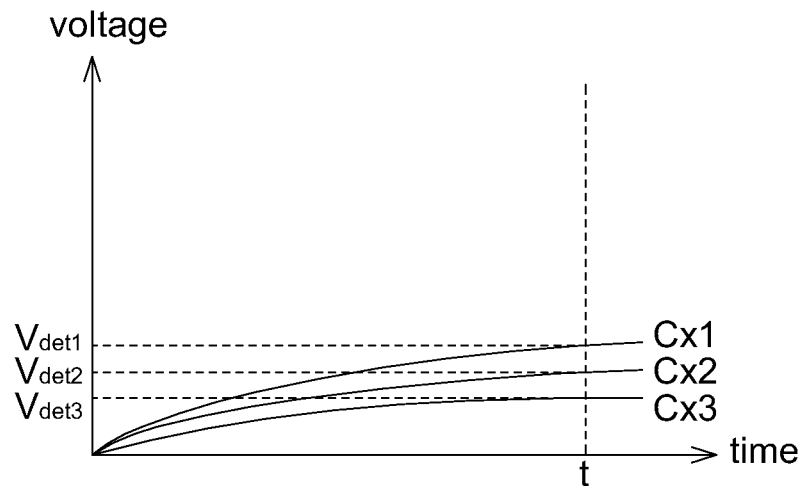
FIG. 1C and FIG. 1D show voltage curves of a storage capacitor when the under-test capacitor has resistor effect.
Figure 1D:
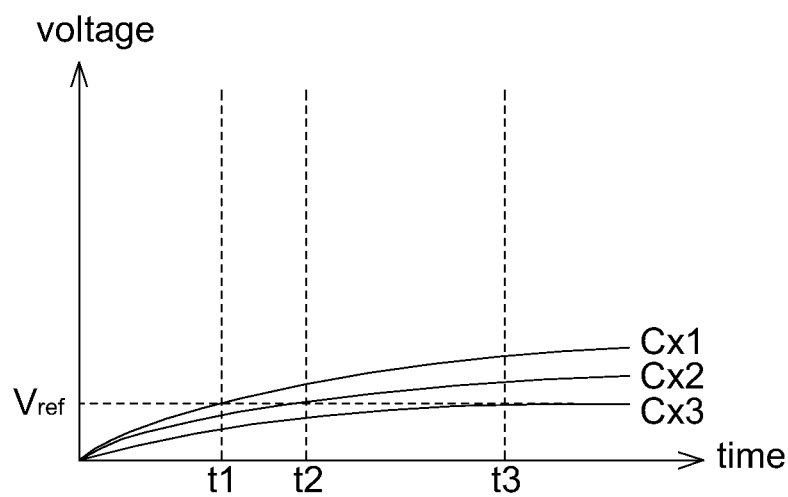
Figure 2:
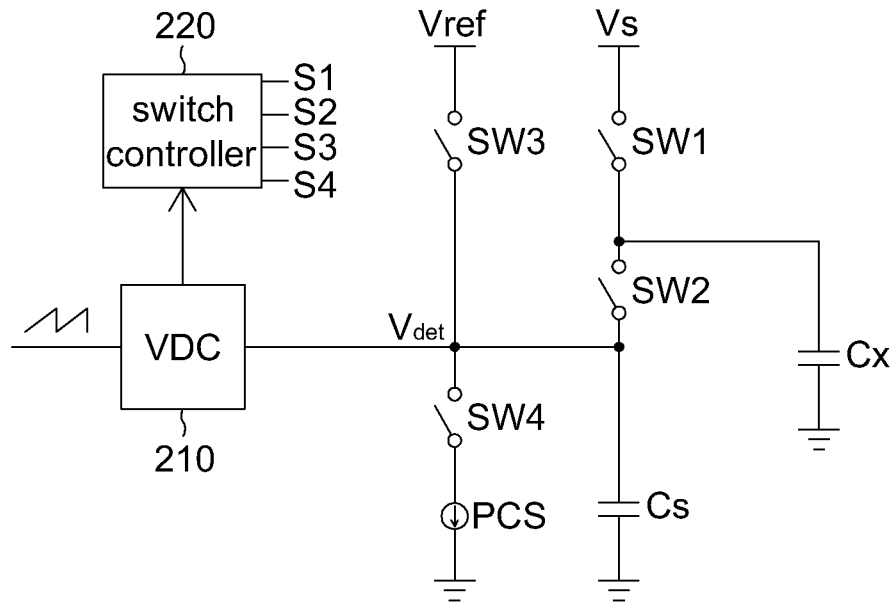
FIG. 2 shows a block diagram of a capacitance measurement circuit according to a first embodiment of the invention.

FIG. 2 shows a block diagram of a capacitance measurement circuit according to a first embodiment of the invention. As indicated in FIG. 2, the capacitance measurement circuit of the first embodiment of the invention includes a voltage detection circuit (VDC) 210, a switch controller 220, four switches SW1-SW4, a storage capacitor Cs and a programmable current source (PCS). The under-test capacitor Cx may have resistor effect other than capacitance effect. However, the measurement time of the capacitance measurement circuit according to the present embodiment of the invention would not be too long.

The voltage detection circuit 210 detects a voltage Vdet on the storage capacitor Cs and further transmits the detected voltage Vdet to the switch controller 220 and the back-stage circuit.

The switch controller 220 generates control signals S1-S4 which control the switches SW1-SW4, respectively. Furthermore, the switch controller 220 generates the control signal S4 according to the voltage Vdet detected by the voltage detection circuit 210.

The switches SW1 and SW2 are used in charge transfer between the storage capacitor Cs and the under-test capacitor Cx. The switch SW3 transmits a reference voltage Vref to the storage capacitor Cs. When the switch SW3 is turned on, the storage capacitor Cs is pre-charged to the reference voltage Vref via the switch SW3. The switch SW4 forms a current path between the storage capacitor Cs and the programmable current source PCS. When the switch SW4 is turned on, the storage capacitor Cs can be discharged through the programmable current source PCS. When the switch SW4 is turned off, the electrical charges on the storage capacitor Cs will be accumulated due to charge transfer (from the under-test capacitor Cx) so as to boost the voltage on the storage capacitor Cs.

Figure 3:
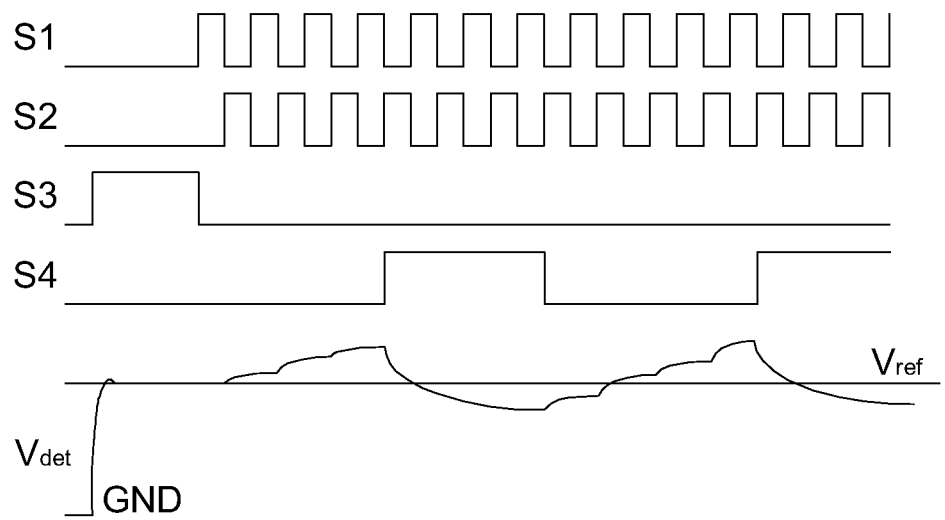
FIG. 3 shows waveform of control signals S1-S4.

Referring to FIG. 3, waveforms of the control signals S1-S4 are shown. In the first embodiment of the invention, when the control signal is at high potential, the switch controlled by the control signal will be turned on; and when the control signal is at low potential, the switch controlled by the control signal will be turned off.

In the first embodiment of the invention, measurement of a capacitance of the under-test capacitor Cx is disclosed below. Referring to FIG. 2 and FIG. 3. Firstly, under control of the Logic H control signal S3, the switch SW3 is turned on so that the storage capacitor Cs is pre-charged to the reference voltage Vref. Meanwhile, the other switches SW1, SW2, SW4 are turned off.

Next, the switch SW3 is turned off; and the switch SW1 and SW2 are alternately turned on for transferring the charges on the under-test capacitor Cx to the storage capacitor Cs. Logic H periods of the control signals S1 and S2 are not overlapped with each other; and charge transfer is performed progressively. At the initial state, the electrical charges on the storage capacitor Cs are 0, and the switch SW1 is used for charging the under-test capacitor Cx to the voltage Vs, and electrical charges Q stored in the under-test capacitor Cx is expressed as formula (1):

$$Q = Cx \times Vs \quad (1)$$

Next, the switch SW1 is turned off and the switch SW2 is turned on, so as to transfer the electrical charges Q to the storage capacitor Cs. After charge balance, the switch SW2 is turned off; and meanwhile, the voltage Vdet on the storage capacitor Cs is expressed in formula (2).

$$V_{det} = Vs \times \frac{Cx}{Cx + Cs} \quad (2)$$

As the switch SW1 and SW2 are repeatedly turned on/off, the voltage Vdet on the storage capacitor Cs will be continually increased, which is expressed in formula (3).

$$V_{det}(N) = \frac{Cx}{Cs + Cx} \times V_{det}(N-1) + \frac{Cx}{Cs + Cx} \times Vs \quad (3)$$

In formula (3), Vdet (N) denotes the voltage on the storage capacitor Cs after the switches SW1 and SW2 are repeatedly turned on/off for N times, wherein N is a positive integer.

Then, when the voltage Vdet on the storage capacitor Cs is higher than the reference voltage Vref, the switch SW4 will be turned on. Meanwhile, the electrical charges stored in the storage capacitor Cs will be discharged through the programmable current source PCS. Therefore, the voltage Vdet on the storage capacitor Cs starts to step down.

When the voltage Vdet on the storage capacitor Cs is lower than the reference voltage Vref, the switch SW4 will be turned off. Meanwhile, as charge transfer between the under-test capacitor Cx and the storage capacitor Cs still continues, the electrical charges on storage capacitor Cs will be accumulated so as to boost the voltage on the storage capacitor Cs.

The voltage detection circuit 210 outputs the detected voltage Vdet to the back-stage circuit for further processing.

The capacitance of the under-test capacitor Cx affects the timing of the control signal S4 and the waveform of the voltage Vdet. In other words, the capacitance of the under-test capacitor Cx can be determined according to the waveform of the voltage Vdet.

Figure 4:
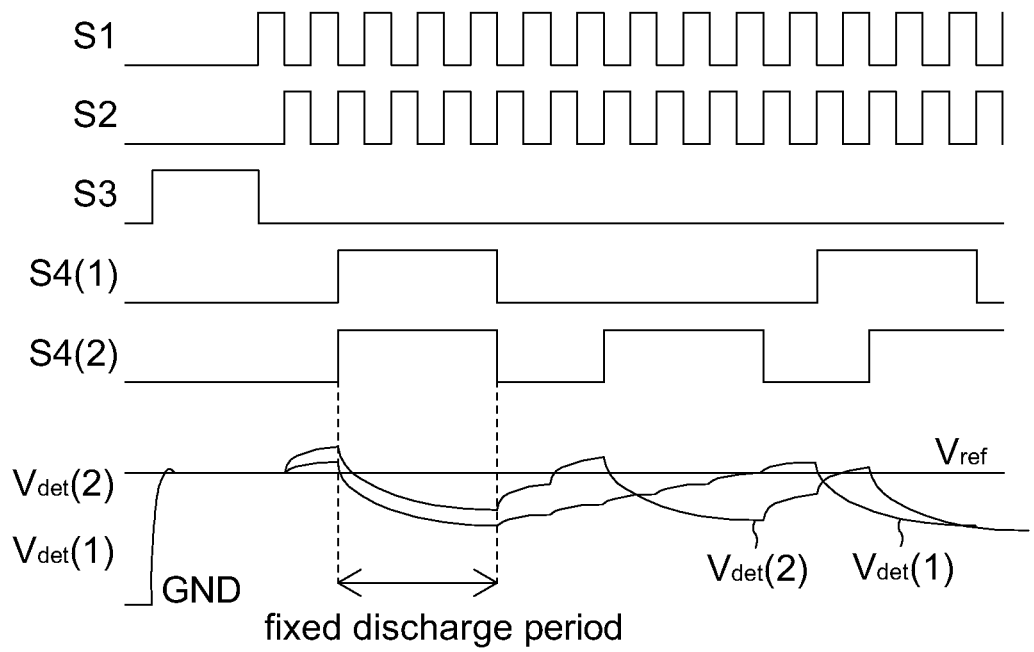
FIG. 4 shows another waveform of the control signals applicable to the first embodiment of the invention.

FIG. 4 shows another waveform of the control signals S1-S4 applicable to the first embodiment of the invention. In FIG. 3, as long as the voltage Vdet on the storage capacitor Cs is higher than the reference voltage Vref, the switch SW4 will be turned on, and as long as the voltage Vdet on the storage capacitor Cs is lower than the reference voltage Vref, the switch SW4 will be turned off. However, in FIG. 4, as long as the voltage Vdet on the storage capacitor Cs is higher than the reference voltage Vref, the switch SW4 will be turned on, and the turned-on period of the switch SW4 is fixed. The turned-on period of the switch SW4 must be long enough, so that the voltage Vdet on the storage capacitor Cs can be discharged to be lower than the reference voltage Vref. After the fixed turned-on period, the switch SW4 will be turned off. Also, in FIG. 4, S4 (1) and Vdet (1) denote waveforms of the control signal S4 and the voltage Vdet when the under-test capacitor has a smaller capacitance, respectively; and S4 (2) and Vdet (2) denote waveforms of the control signal S4 and the voltage Vdet when the under-test capacitor has a larger capacitance, respectively. That is, in FIG. 4, the discharge period of the storage capacitor Cs is fixed.

Figure 5:
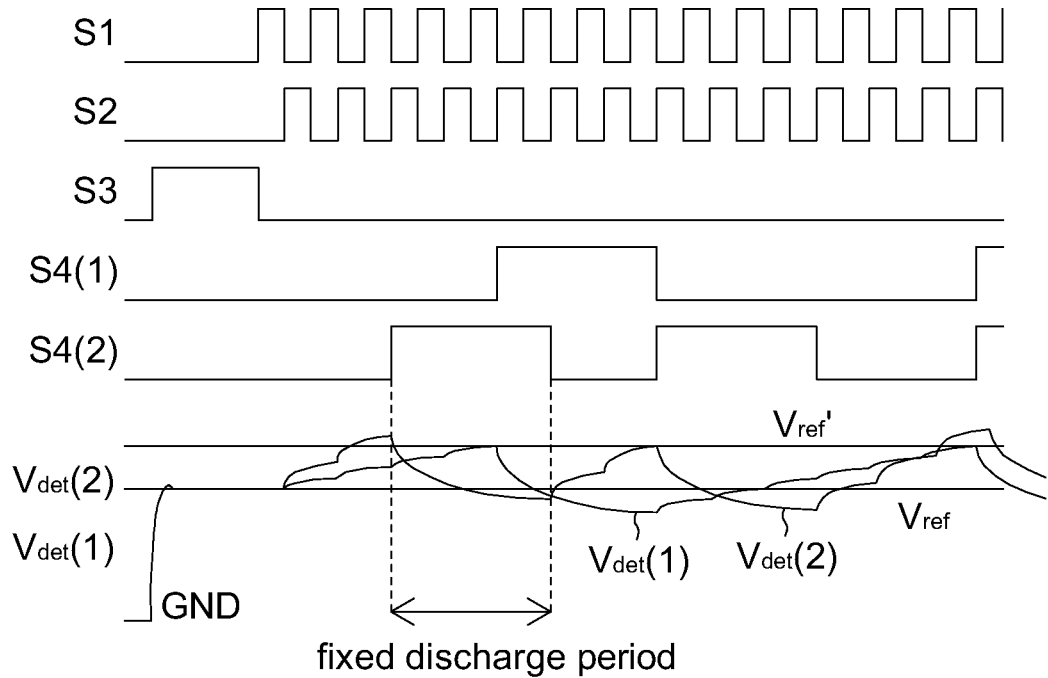
FIG. 5 shows still another waveform of the control signals applicable to the first embodiment of the invention.

FIG. 5 shows still another waveforms of the control signals S1-S4 applicable to the first embodiment of the invention. In FIG. 5, when the voltage Vdet on the storage capacitor Cs is higher than another reference voltage Vref' (Vref'>Vref), the switch SW4 is turned on, wherein the turned-on period of the switch SW4 is fixed. The turned-on period of the switch SW4 must be long enough, so that the voltage Vdet on the storage capacitor Cs can be discharged to be lower than the reference voltage Vref. After the fixed turned-on period, the switch SW4 will be turned off. Also, in FIG. 5, S4 (1) and Vdet (1) denote waveforms of the control signal S4 and the voltage Vdet when the under-test capacitor has a smaller capacitance, respectively; and S4 (2) and Vdet (2) denote waveforms of the control signal S4 and the voltage Vdet when the under-test capacitor has a larger capacitance, respectively. That is, in FIG. 5, the discharge period of the storage capacitor Cs is fixed as well.

Figure 6:
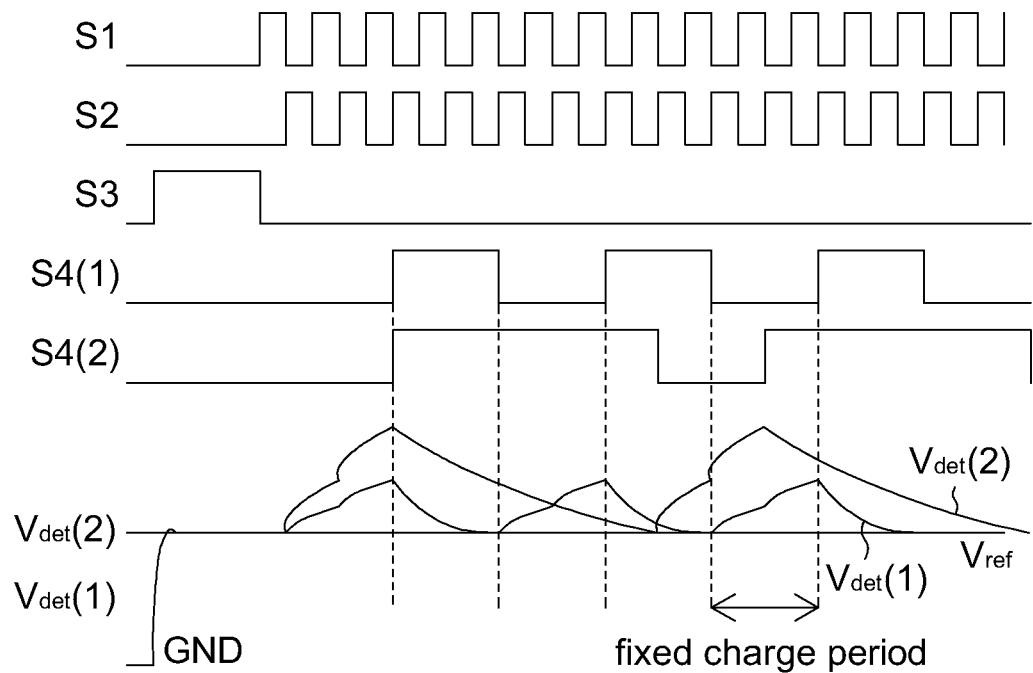
FIG. 6 shows yet another waveform of the control signals applicable to the first embodiment of the invention.

FIG. 6 shows yet another waveforms of the control signals S1-S4 applicable to the first embodiment of the invention. In FIG. 6, when the voltage Vdet on the storage capacitor Cs is higher than the reference voltage Vref, the switch SW4 will be turned on, wherein the turned-on period of the switch SW4 must be long enough so that the voltage Vdet on the storage capacitor Cs can be discharged to be lower than the reference voltage Vref. In FIG. 6, the turned-on period of the switch SW4 may be not fixed. After the turned-on period, the switch SW4 will be turned off, wherein the turned-off period of the switch SW4 is fixed. Like what is disclosed above, when the switch SW4 is turned off, the voltage Vdet on the storage capacitor Cs will be gradually boosted due to charge transfer. Thus, in FIG. 6, the charge period of the storage capacitor Cs can be fixed. Furthermore, in FIG. 6, S4 (1) and Vdet (1) denote waveforms of the control signal S4 and the voltage Vdet when the under-test capacitor has a smaller capacitance, respectively; and S4 (2) and Vdet (2) denote waveforms of the control signal S4 and the voltage Vdet when the under-test capacitor has a larger capacitance, respectively.

Second Embodiment

Figure 7:
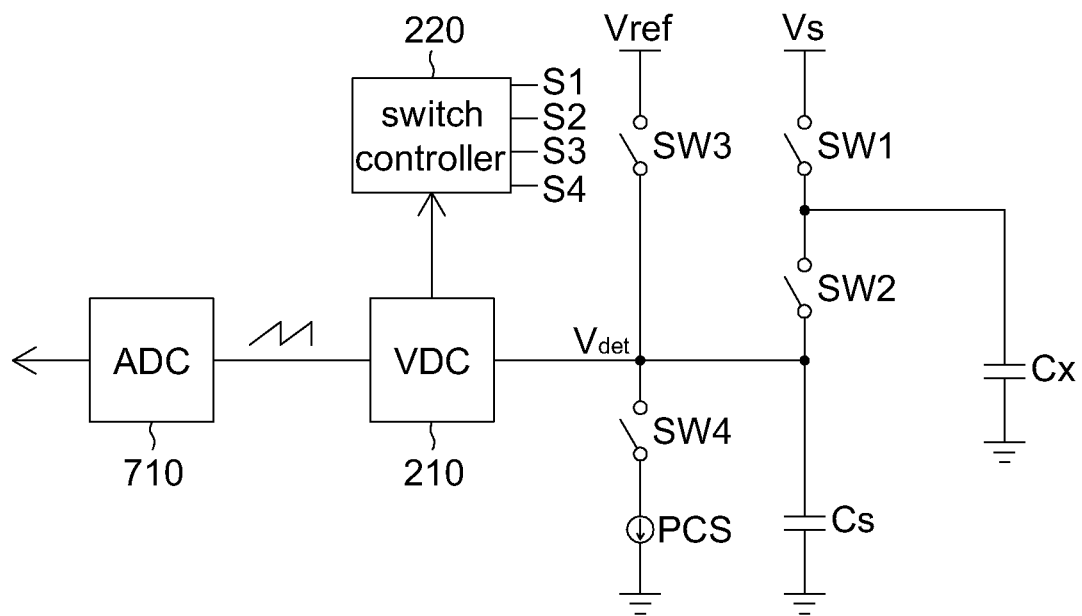
FIG. 7 shows a block diagram of a capacitance measurement circuit according to a second embodiment of the invention.

FIG. 7 shows a block diagram of a capacitance measurement circuit according to a second embodiment of the invention. Compared with the capacitance measurement circuit of the first embodiment, the capacitance measurement circuit of the second embodiment further includes an analog digital converter (ADC) 710 for converting the analog signal (the voltage Vdet) outputted from the VDC 210 into digital signal. FIG. 8A-FIG. 8D show different conversion operations by the ADC 710.

Figure 8A:
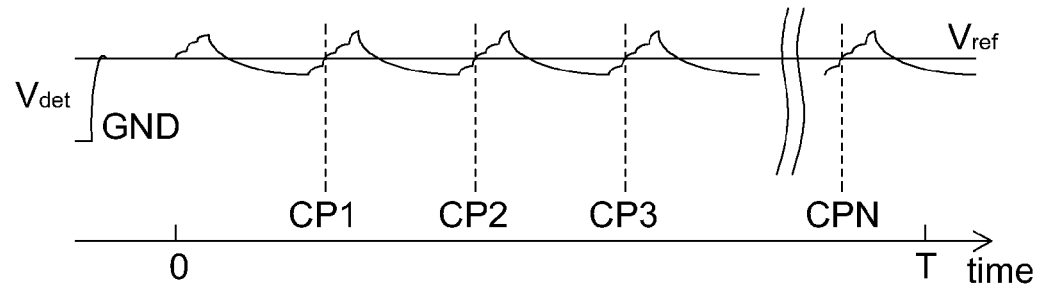
FIG. 8A-FIG. 8D show the conversion of an analog digital converter according to the second embodiment of the invention, wherein the output result reflects the capacitance of the under-test capacitor.

Referring to FIG. 8A. As disclosed above, the charge state of the voltage $V_{det}$ is related to the capacitance of the under-test capacitor $C_X$. If the measurement in FIG. 4 or FIG. 5 is adopted (that is, the waveform of the control signal S4 in FIG. 4 or FIG. 5 is adopted), the smaller capacitance the under-test capacitor $C_X$ has, the faster the voltage $V_{det}$ is charged, and more cross over points (CP1-CPN) exist between the voltage $V_{det}$ and the reference line (V=Vref). If the ADC 710 is an accumulator, then a predetermined time interval T is defined; and the count of the cross-over points between the voltage $V_{det}$ and the reference line (V=Vref) within the time interval T is accumulated by the ADC 710. The count of the accumulated cross-over point reflects relative capacitance of the under-test capacitor $C_X$.

Figure 8B:
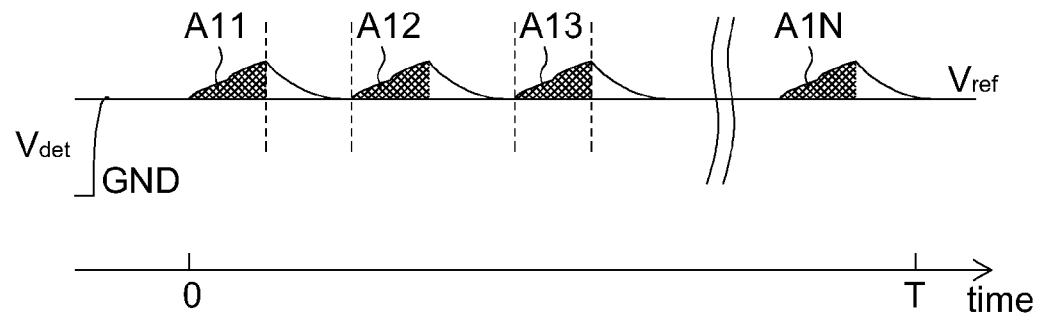

Referring to FIG. 8B. If the measurement in FIG. 6 is adopted (that is, the waveform of the control signal S4 in FIG. 6 is adopted), then the larger capacitance the under-test capacitor $C_X$ has, and the larger the area enclosed by the charge waveform of the voltage $V_{det}$ and the reference line (V=Vref) will be. If the ADC 710 is an integrator, then the area within the time interval T can be integrated by the ADC 710 (i.e. the areas A11~A1N in FIG. 8B are integrated). The integrated area reflects relative capacitance of the under-test capacitor $C_X$.

Figure 8C:
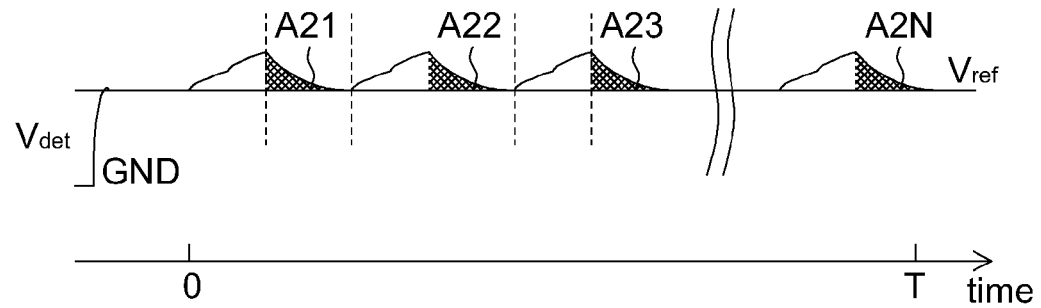

Referring to FIG. 8C. If the measurement in FIG. 6 is adopted (that is, the waveform of the control signal S4 in FIG. 6 is adopted), then the larger capacitance the under-test capacitor $C_X$ has, and the larger the area enclosed by the charge waveform of the voltage $V_{det}$ and the reference line (V=Vref) will be. If the ADC 710 is an integrator, then the area within the time interval T is integrated by the ADC 710 (the areas A21~A2N in FIG. 8C are integrated). The integrated area reflects relative capacitance of the under-test capacitor $C_X$.

Figure 8D:
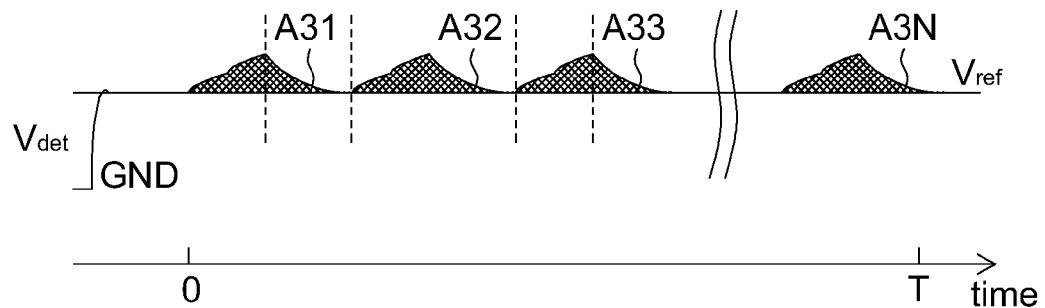

Referring to FIG. 8D. If the measurement in FIG. 6 is adopted (that is, the waveform of the control signal S4 in FIG. 6 is adopted), the larger capacitance the under-test capacitor $C_X$ has, and the larger the area enclosed by the charge/discharge waveform of the voltage $V_{det}$ and the reference line (V=Vref) will be. If the ADC 710 is an integrator, then the area within the time interval T can be integrated by the ADC 710 (the areas A31~A3N in FIG. 8D are integrated). The integrated area reflects relative capacitance of the under-test capacitor $C_X$.

Third Embodiment

Figure 9:
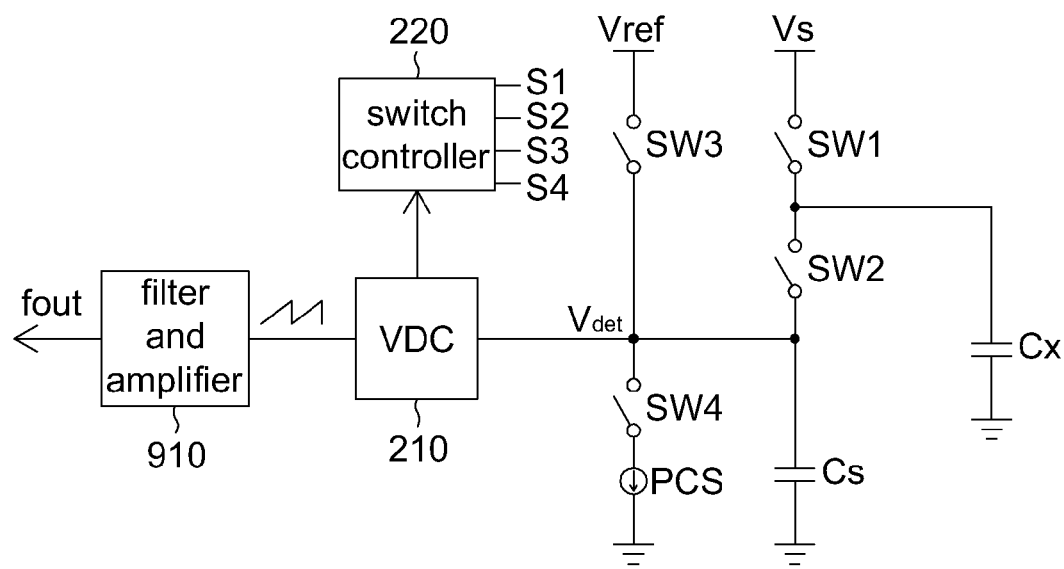
FIG. 9 shows a block diagram of a capacitance measurement circuit according to a third embodiment of the invention.
Figure 10:
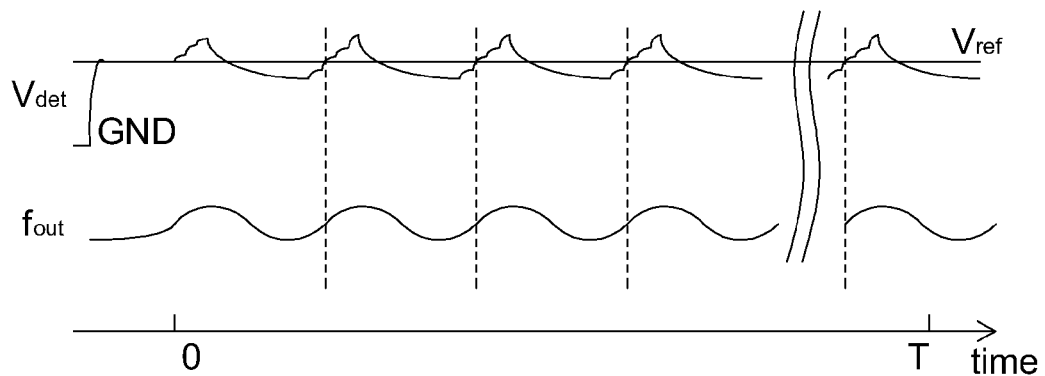
FIG. 10 shows the filtering and amplification by a filter and an amplifier according to a third embodiment of the invention, wherein the output result reflects the capacitance of the under-test capacitor.

FIG. 9 shows a block diagram of a capacitance measurement circuit according to a third embodiment of the invention. Compared with the capacitance measurement circuit of the first embodiment, the capacitance measurement circuit of the third embodiment further includes a filterer and an amplifier 910 for filtering and amplifying the analog signal (voltage Vdet) outputted from the VDC 210 so as to output an analog signal. FIG. 10 shows the filtering and amplification by the filter and the amplifier 910.

Referring to FIG. 10. If the measurement in FIG. 4, FIG. 5 or FIG. 6 is adopted (that is, the waveform of the control signal S4 in FIG. 4, FIG. 5 or FIG. 6 is adopted), then the smaller capacitance the under-test capacitor $C_X$ has, the faster voltage $V_{det}$ is charge/discharge; and the higher frequency the filtered-amplified signal $f_{out}$ has. Thus, the frequency of the signal $f_{out}$ can reflect relative capacitance of the under-test capacitor $C_X$.

Figure 11:
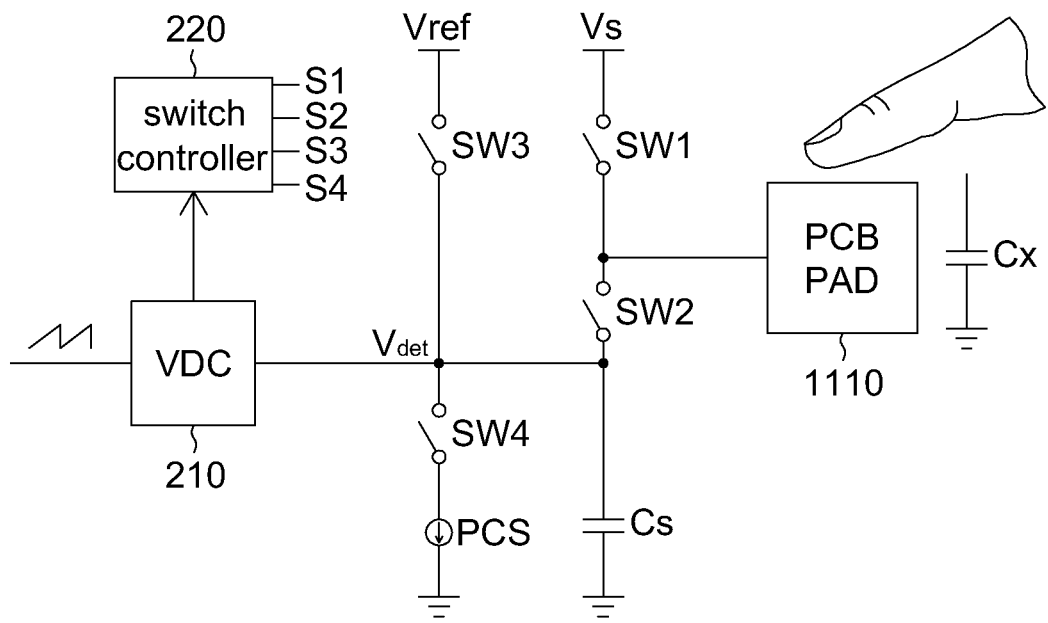
FIG. 11 shows usage of the first embodiment of the invention in a capacitive switch.

The above embodiments of the invention can be used in capacitive switches. Further, the above embodiments of the invention can detect whether the capacitive switch is pressed by the user. When the user presses the capacitive switch, a tiny capacitance can be induced. According to the above embodiments of the invention, this tiny induced capacitance can be detected for determining whether the capacitive switch is pressed by the user. FIG. 11 shows usage of the first embodiment of the invention in a capacitive switch. As indicated in FIG. 11, the capacitance measurement capacitance of the first embodiment of the invention is connected to a PCB PAD 1110 on a printed circuit board (PCB). When a conductive object such as human body approaches, a tiny capacitance will be inducted on the PCB PAD 1110 due to inductive capacitance effect. Such tiny capacitance can be detected by the above first embodiment and of course other embodiments of the invention.

Figure 12:
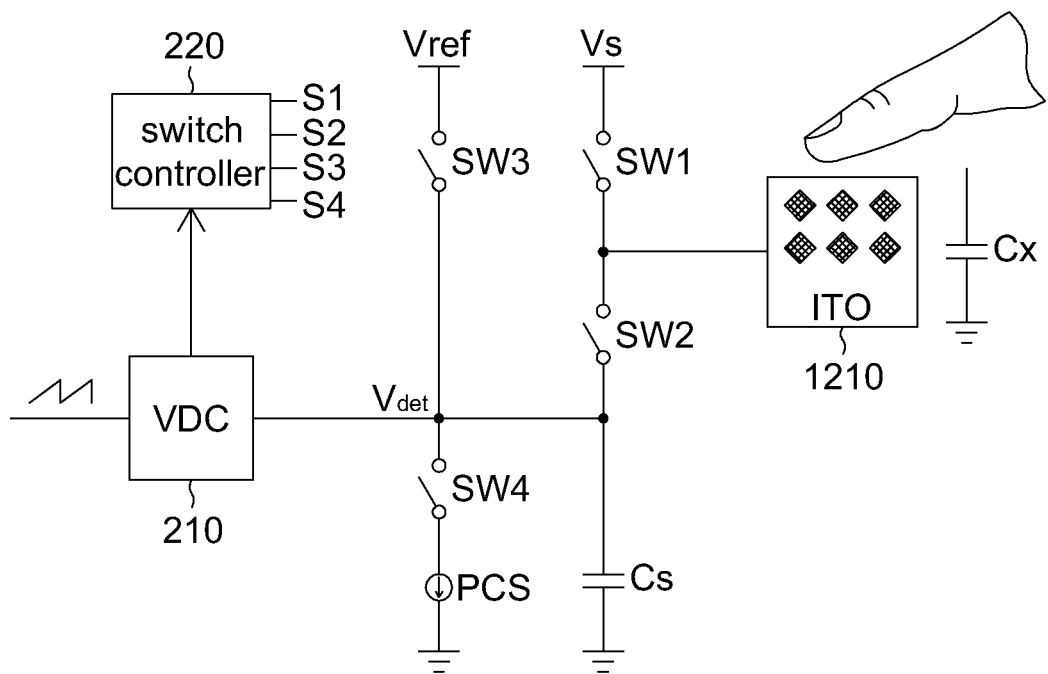
FIG. 12 shows usage of the first embodiment of the invention in a touch panel or a display touch panel.

The above embodiments of the invention can be used in touch panels or display touch panels. Further, the above embodiments of the invention can detect a user's touch position on the touch panel or on the display touch panel. The user's touch position on the touch panel or on the display touch panel is related to or induces the inducted capacitance. When the user touches, due to inductive capacitance effect, a tiny capacitance will be inducted on the panel. Different touch positions are related to or induce different inductive capacitances. Such tiny capacitance can be detected by the above embodiments of the invention for determining the touch position. FIG. 12 shows usage of the above first embodiment of the invention in the touch panel or the display touch panel. As indicated in FIG. 12, the capacitance measurement capacitance of the first embodiment of the invention is connected to a conductive surface including a conductive film 1210 such as indium tin oxide (ITO) conductive glass for example. When a conductive object (such as human body) approaches, a tiny capacitance is inducted on the conductive film 1210 due to the inductive capacitance effect. Such tiny capacitance can be detected by the above first embodiment and of course other embodiments of the invention.

The capacitance measurement circuit disclosed in the above embodiments of the invention has many advantages exemplified below:

Short measurement time: as the storage capacitor is precharged, the voltage of the storage capacitor can be boosted to a reference voltage, so that the measurement time is shorten.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A capacitance measuring method for measuring a capacitance of an under-test capacitor, the measuring method comprising:
   pre-charging a storage capacitor;
   performing a charge transfer between the under-test capacitor and the storage capacitor;
   charging and discharging the storage capacitor, including
      discharging the storage capacitor when a voltage of the storage capacitor is higher than a reference voltage, and
      charging the storage capacitor when the voltage of the storage capacitor is lower than the reference voltage; and
   measuring the capacitance of the under-test capacitor according to the voltage of the storage capacitor.

2. The capacitance measuring method according to claim 1, wherein the step of pre-charging the storage capacitor comprises:
   pre-charging the storage capacitor to the reference voltage.

3. The capacitance measuring method according to claim 1, wherein, a discharge period for discharging the storage capacitor is fixed.

4. The capacitance measuring method according to claim 1, wherein the reference voltage is a first reference voltage and the step of charging and discharging the storage capacitor comprises:
   discharging the storage capacitor when the voltage of the storage capacitor is higher than a second reference voltage, wherein the second reference voltage is higher than the first reference voltage, and
   charging the storage capacitor when the voltage of the storage capacitor is lower than the reference voltage;
   wherein, a discharge period for discharging the storage capacitor is fixed.

5. The capacitance measuring method according to claim 1, wherein
   a charge period for charging the storage capacitor is fixed.

6. The capacitance measuring method according to claim 1, wherein the step of measuring the capacitance of the under-test capacitor comprises:
   accumulating a count of cross-over points between the voltage of the storage capacitor and a reference line within a predetermined time interval to reflect the capacitance of the under-test capacitor.

7. The capacitance measuring method according to claim 1, wherein the step of measuring the capacitance of the under-test capacitor comprises:
   integrating an area enclosed by a charge waveform of the voltage of the storage capacitor and a reference line within a predetermined time interval to reflect the capacitance of the under-test capacitor.

8. The capacitance measuring method according to claim 1, wherein the step of measuring the capacitance of the under-test capacitor comprises:
   integrating an area enclosed by a discharge waveform of the voltage of the storage capacitor and a reference line within a predetermined time interval to reflect the capacitance of the under-test capacitor.

9. The capacitance measuring method according to claim 1, wherein the step of measuring the capacitance of the under-test capacitor comprises:
   integrating an area enclosed by a charge/discharge waveform of the voltage of the storage capacitor and a reference line within a predetermined time interval to reflect the capacitance of the under-test capacitor.

10. The capacitance measuring method according to claim 1, wherein the step of measuring the capacitance of the under-test capacitor comprises:
   filtering and amplifying the voltage of the storage capacitor to obtain an output analog signal, wherein a frequency of the output analog signal reflects the capacitance of the under-test capacitor.

11. A capacitance measurement circuit for measuring a capacitance of an under-test capacitor, comprising:
   a storage capacitor;
   a switch circuit coupled to the storage capacitor, a reference voltage and a voltage source;
   a voltage detector coupled to the storage capacitor for detecting a voltage of the storage capacitor;
   a switch controller coupled to the voltage detector and the switch circuit for controlling the switch circuit; and
   a current source coupled to the switch circuit;
   wherein, under control of the switch controller, the reference voltage is coupled to the storage capacitor through the switch circuit to pre-charge the storage capacitor;
   the under-test capacitor is coupled to the storage capacitor and the voltage source for performing charge transfer between the under-test capacitor and the storage capacitor;

discharging the storage capacitor by the current source when the voltage of the storage capacitor is higher than the reference voltage; and charging the storage capacitor by the under-test capacitor by charge transfer according to a relationship between when the voltage of the storage capacitor is lower than the reference voltage.

12. The capacitance measurement circuit according to claim 11, wherein, the switch circuit comprises:
   a first switch for selectively coupling the voltage source to the under-test capacitor;
   a second switch for selectively coupling the storage capacitor to the under-test capacitor;
   a third switch for selectively coupling the reference voltage to the storage capacitor; and
   a fourth switch for selectively coupling the current source to the storage capacitor.

13. The capacitance measurement circuit according to claim 12, wherein,
   when the voltage detection circuit detects that the voltage of the storage capacitor is higher than the reference voltage, the switch controller turns on the fourth switch, so that the current source is coupled to the storage capacitor to discharge the storage capacitor; and
   when the voltage detection circuit detects that the voltage of the storage capacitor is lower than the reference voltage, the switch controller turns off the fourth switch and the under-test capacitor charges the storage capacitor.

14. The capacitance measurement circuit according to claim 13, wherein, the switch controller turns on the fourth switch, so that a discharge period for discharging the storage capacitor is fixed.

15. The capacitance measurement circuit according to claim 12, wherein the reference voltage is a first reference voltage and wherein,
   when the voltage detection circuit detects that the voltage of the storage capacitor is higher than a second reference voltage, the switch controller turns on the fourth switch, so that the current source is coupled to the storage capacitor to discharge the storage capacitor, the second reference voltage is higher than the first reference voltage, and a discharge period for discharging the storage capacitor is fixed; and
   when the voltage detection circuit detects that the voltage of the storage capacitor is lower than the first reference voltage, the switch controller turns off the fourth switch and the under-test capacitor charges the storage capacitor.

16. The capacitance measurement circuit according to claim 12, wherein,
   when the voltage detection circuit detects that the voltage of the storage capacitor is higher than the reference voltage, the switch controller turns on the fourth switch for coupling the current source to the storage capacitor to discharge the storage capacitor; and
   when the voltage detection circuit detects that the voltage of the storage capacitor is lower than the reference voltage, the switch controller turns off the fourth switch and the under-test capacitor charges the storage capacitor, a charging period for charging the storage capacitor being fixed.

17. The capacitance measurement circuit according to claim 11, further comprising:
   an analog digital converter coupled to the voltage detection circuit for converting the voltage of the storage capacitor into a digital data which reflects the capacitance of the under-test capacitor.

18. The capacitance measurement circuit according to claim 17, wherein, the analog digital converter accumulates a count of cross-over points between the voltage of the storage capacitor and a reference line within a predetermined time interval.

19. The capacitance measurement circuit according to claim 17, wherein, the analog digital converter integrates an area enclosed by a charge waveform of the voltage of the storage capacitor and a reference line within a predetermined time interval.

20. The capacitance measurement circuit according to claim 17, wherein, the analog digital converter integrates an area enclosed by a discharge waveform of the voltage of the storage capacitor and a reference line within a predetermined time interval.

21. The capacitance measurement circuit according to claim 17, wherein, the analog digital converter integrates an area enclosed by a charge/discharge waveform of the voltage of the storage capacitor and a reference line within a predetermined time interval.

22. The capacitance measurement circuit according to claim 11, further comprising:
   a filter and an amplifier coupled to the voltage detection circuit for converting the voltage of the storage capacitor into an analog data which reflects the capacitance of the under-test capacitor.

* * * * *